United States Patent
Gutsche et al.

(10) Patent No.: US 6,177,353 B1
(45) Date of Patent: *Jan. 23, 2001

(54) METALLIZATION ETCHING TECHNIQUES FOR REDUCING POST-ETCH CORROSION OF METAL LINES

(75) Inventors: Martin Gutsche, Dammerlberg (DE); Peter Strobl, Glen Allen, VA (US); Stephan Wege, Weissiy Dresden; Eike Lueken, Radebeul, both of (DE); Georg Stojakovic, Poughkeepsie, NY (US); Bruno Spuler, Weixdorf (DE)

(73) Assignee: Infineon Technologies North America Corp., San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/153,390

(22) Filed: Sep. 15, 1998

(51) Int. Cl.$^7$ .................................................. H01L 21/027
(52) U.S. Cl. ......................... 438/704; 438/710; 438/745
(58) Field of Search .................................... 438/710, 745, 438/704

(56) References Cited

U.S. PATENT DOCUMENTS

| | | | |
|---|---|---|---|
| 5,211,804 | 5/1993 | Kobayashi | 156/665 |
| 5,270,254 | * 12/1993 | Chen et al. | 437/190 |
| 5,277,750 | * 1/1994 | Frank | 156/643 |
| 5,371,410 | * 12/1994 | Chen et al. | 257/750 |
| 5,545,289 | 8/1996 | Chen et al. | 156/643.1 |
| 5,573,973 | * 11/1996 | Sethi et al. | 437/67 |
| 5,654,233 | * 8/1997 | Yu | 438/643 |
| 5,741,741 | * 4/1998 | Tseng | 438/637 |
| 5,779,926 | * 7/1998 | Ma et al. | 216/67 |
| 5,792,687 | * 8/1998 | Jeng et al. | 438/253 |
| 5,801,082 | * 9/1998 | Tseng | 438/424 |
| 5,827,437 | * 10/1998 | Yang et al. | 216/77 |
| 5,834,805 | * 11/1998 | Tang | 257/304 |
| 5,920,799 | * 7/1999 | Graves et al. | 438/798 |

FOREIGN PATENT DOCUMENTS 2 286 721    8/1995 (GB).

* cited by examiner

*Primary Examiner*—Felisa Hiteshew
*Assistant Examiner*—Vanessa Perez-Ramos
(74) *Attorney, Agent, or Firm*—Stanton Braden

(57) ABSTRACT

A method for reducing polymer deposition on vertical surfaces of metal lines etched from a metallization layer disposed above a substrate. The method includes forming a hard mask layer above the metallization layer and providing a photoresist mask above the hard mask layer. The method further includes employing the photoresist mask to form a hard mask from the hard mask layer. The hard mask has patterns therein configured to form the metal lines in a subsequent plasma-enhanced metallization etch. There is also included removing the photoresist mask. Additionally, there is included performing the plasma-enhanced metallization etch employing the hard mask and an etchant source gas that includes $Cl_2$ and at least one passivation-forming chemical, wherein the plasma-enhanced metallization etch is performed without employing photoresist to reduce the polymer deposition during the plasma-enhanced metallization etch.

15 Claims, 2 Drawing Sheets

METALLIZATION ETCHING TECHNIQUES FOR REDUCING POST-ETCH CORROSION OF METAL LINES

BACKGROUND OF THE INVENTION

The present invention relates to techniques for etching through a metallization layer on a substrate. More particularly, the present invention relates to techniques for etching through the metallization layer while reducing corrosion due to byproducts produced during prior art metallization etch processes.

In the fabrication of semiconductor integrated circuits, metal lines are often employed as conductive paths between the devices on the integrated circuit. To form the metal lines and features, a metal layer is typically blanket deposited over the surface of the wafer. Using an appropriate photoresist mask, portions of the metal layer are then etched away, leaving behind metal lines and features.

As the density of integrated circuits increases and the feature sizes decrease, a variety of techniques has been developed to properly etch the ever shrinking features of the integrated circuit. One of these techniques involves plasma-enhanced etching. To facilitate discussion, FIG. 1 depicts a metal layer 102 disposed on a substrate 104. Substrate 104 may represent the wafer itself or, more commonly, a layer upon which metal layer 102 is disposed such as an oxide layer. In the example of FIG. 1, metal layer 102 includes a barrier layer 106, typically formed of a material such as titanium. In some cases, barrier layer 106 may represent a composite layer, which includes a titanium nitride (TiN) overlaying a titanium layer. Metal layer 108 is typically formed of aluminum or one of its alloys such as aluminum/copper or aluminum/copper/silicon. Between metal layer 108 and photoresist mask 110, there is disposed a barrier/ARC (anti-reflective coating) layer 112. Barrier/ARC layer 112 may include, for example, an overlaying anti-reflective coating, which may be organic or inorganic in character. One skilled in the art would recognize that the anti-reflective coating layer is provided primarily for the lithography purposes. A barrier layer of titanium and/or titanium nitride may be disposed under the aforementioned anti-reflective coating layer. Although metal layer 102 is shown including barrier/ARC layer 112, metal layer 108, and barrier layer 106, one skilled in the art would readily recognize that both barrier/ARC layer 112 and barrier layer 106 are optional and one or both may be omitted in some ICs.

Photoresist mask 110 represents a portion of the photoresist mask that has been formed using an appropriate photoresist process. During the etching of metal layer 102, photoresist mask 110 protects the portions of the metal layer 102 disposed below the photoresist features, thereby forming features out of the underlying metal layer. By way of example, the etching of metal layer 102 produces a line disposed perpendicular to the page on which FIG. 1 is depicted.

In FIG. 2, etching is completed and portions of metal layer 102 that are not protected by the photoresist features are removed. Typically, the etching of an aluminum-containing metal layer is accomplished in a plasma reactor using, for example, etching source gases such as $Cl_2/BCl_3$, $CL_2/HCl$, $CL_2/N_2$, and the like. The etching may be performed in accordance with a plasma-enhanced process known as reactive ion etching (RIE), for example. In FIG. 2, there are shown polymer side walls 202A and 202B coating the vertical surfaces of metal feature 204. Typically, the polymer side walls contain organic materials such as sputtered photoresist from photoresist mask 110, resputtered material from the metallization layers (such as aluminum, titanium, and the like), material sputtered from the underlying layer (such as from substrate 104) and a nontrivial amount of chlorine and/or chlorine-containing compounds from the etching source gas. As will be discussed later herein, the polymer side walls need to be removed as part of the post metallization processing steps.

In FIG. 3, the photoresist mask is removed. In a typical plasma-enhanced process, photoresist mask removal may be achieved by stripping away the photoresist material in a downstream ash plasma reactor using, for example, $O_2/H_2O$ vapor or $O_2$ as the ashing material. As is typically the case, the photoresist strip process removes very little, if any, of the side wall polymers. Consequently, the polymer side walls remain after the photoresist strip process and must be removed in a subsequent process step. Complete removal of the polymer side walls is highly desirable because if side wall polymer remains attached to the metal line, the chlorine therein may react with moisture in the ambient environment, forming corrosive acids that attack the metal lines. As can be appreciated by those skilled in the art, erosion of the metal lines changes the electrical characteristics of metal lines, e.g., increasing their resistivity. In some cases, the corrosion may be severe enough to sever the conductive path, forming an open circuit where none is intended.

As mentioned, a separate process is typically required in the prior art to remove the polymer side walls that remain after the photoresist strip process. In the prior art, polymer side wall removal is typically accomplished by a wet etch process since it has been found that plasma-enhanced etching is relatively inefficient in removing the deposited polymer. The wet etch may be preceded by a passivating plasma process and/or a deionized water rinse process. The wet etch process typically employs a suitable wet etchant such as chromic phosphoric, diluted sulfuric peroxide, organic solvents EKC265 from EKC Technology, Inc. of Hayward, Calif. or ACT935 from Ashland Chemical Company of Columbus, Ohio. FIG. 4 shows the metallization feature of FIG. 3 after the wet etch has been performed to remove the polymer side walls.

Although the wet etch process accomplishes its purpose of removing the polymer side wall, there are disadvantages. For example, the wet etch process typically employs corrosive chemicals that typically do not have a high selectivity to aluminum. If the wet etch process is not carefully controlled, the wet etchant can attack the aluminum lines especially at the interface with the upper and/or lower barrier layers or at the interface between an aluminum line and an underlying tungsten stud. The stud-related corrosion is particularly severe if there is any stud that is misaligned with the metal line (due to, e.g., manufacturing tolerance) and is therefore not completely covered by a metal line. On the other hand, the wet etch must be allowed to proceed sufficiently such that substantially all side wall polymers are removed to prevent the aforementioned corrosion problem. Because of the relatively narrow process window, the use of the wet etch process to remove the polymer side walls has posed many challenges to process engineers.

SUMMARY OF THE INVENTION

The invention relates, in one embodiment, to a method for reducing polymer deposition on vertical surfaces of metal lines etched from a metallization layer disposed above a substrate. The method includes forming a hard mask layer above the metallization layer and providing a photoresist mask above the hard mask layer. The method further includes employing the photoresist mask to form a hard mask from the hard mask layer. The hard mask has patterns therein configured to form the metal lines in a subsequent plasma-enhanced metallization etch. There is also included removing the photoresist mask. Additionally, there is included performing the plasma-enhanced metallization etch employing the hard mask and an etchant source gas that includes $Cl_2$ and at least one passivation-forming chemical, wherein the plasma-enhanced metallization etch is performed without employing photoresist to reduce the polymer deposition during the plasma-enhanced metallization etch.

In another embodiment, the invention relates to a method for reducing corrosion of metal lines etched from a metallization layer that is disposed above a substrate. The method includes providing the substrate having thereon the metallization layer. The metallization layer includes at least two layers having different electrochemical characteristics. The method additionally includes forming a hard mask layer above the metallization layer and providing a photoresist mask above the hard mask layer. Further, there is included employing the photoresist mask to form a hard mask from the hard mask layer. The hard mask has patterns therein configured to form the metal lines in a subsequent plasma-enhanced metallization etch. The method also includes removing the photoresist mask and performing the plasma-enhanced metallization etch employing the hard mask and an etchant source gas that includes Cl2 and at least one passivation-forming chemical, wherein the plasma-enhanced metallization etch is performed without employing photoresist to reduce photoresist-based polymer deposition during the plasma-enhanced metallization etch. The method additionally includes performing a wet etch to remove polymer side walls formed during the plasma-enhanced metallization etch. The wet etch is performed while the hard mask is disposed above the metal lines to reduce the corrosion due to an electrolysis reaction between the at least two metal layers during the wet etch.

In yet another embodiment, the invention relates to a method for reducing erosion during wet clean of etched metal features being etched earlier from a metallization layer. The wet clean is performed to remove at least one of sidewall passivation and polymer deposition on vertical surfaces of the etched metal features. The method includes providing a hard mask above the metallization layer. The method also includes etching the metallization layer in a plasma processing chamber using the hard mask. The etching forms the etched metal features. The method additionally includes performing the wet clean without removing the hard mask, wherein the hard mask caps upper surfaces of the etched metal features to reduce exposure of the etched metal features to wet etch solution employed in the wet etch.

These and other features of the present invention will be described in more detail below in the detailed description of the invention and in conjunction with the following figures.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Figure 1:
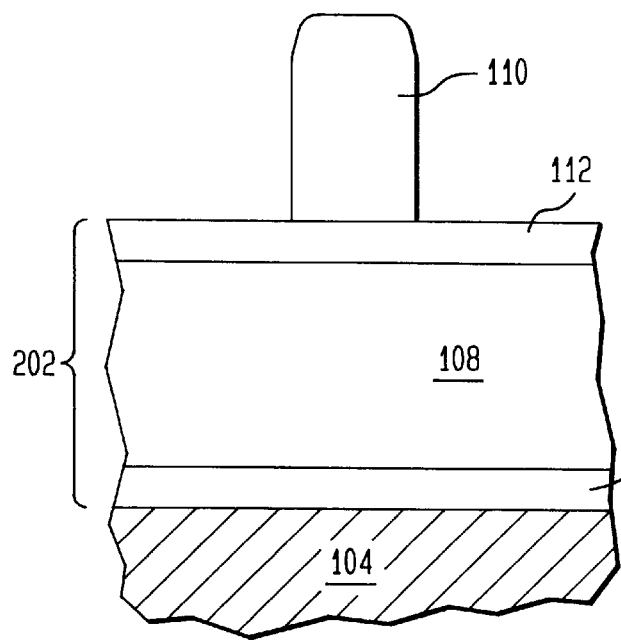
FIG. 1 depicts a metal layer disposed on a substrate, including the photoresist mask disposed above the metal layer for metallization etching.
Figure 2:
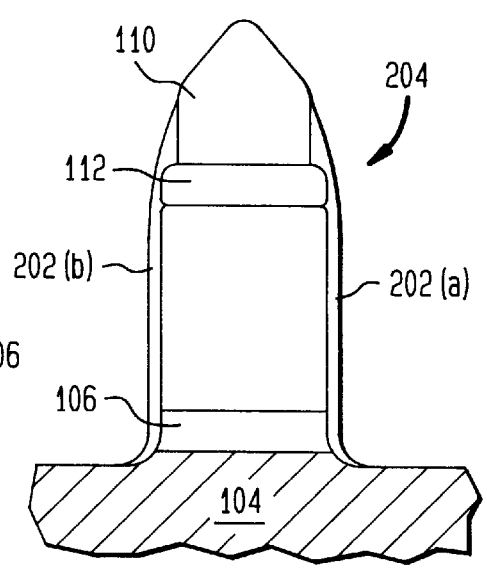
FIG. 2 depicts the substrate of FIG. 1 after the metallization layer is etched.
Figure 3:
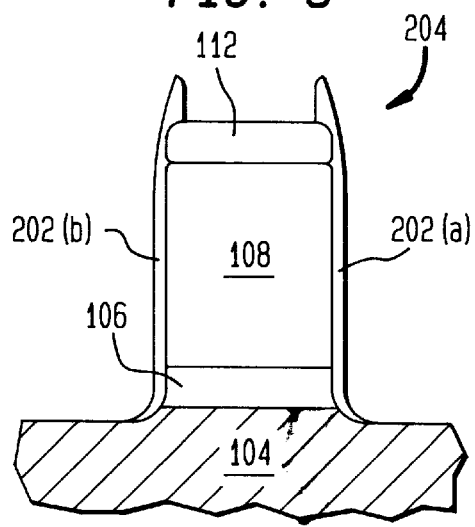
FIG. 3 depicts the substrate of FIG. 2 after the photoresist mask is removed.
Figure 4:
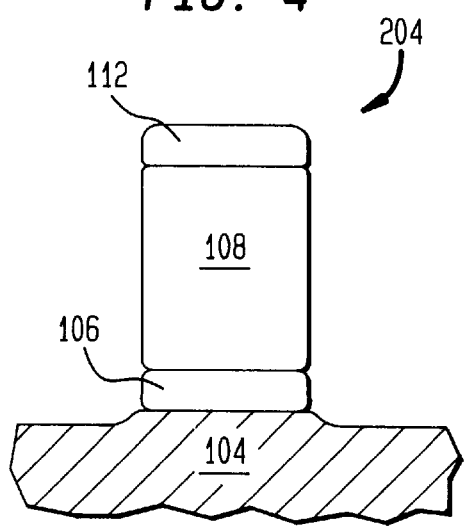
FIG. 4 shows the metallization feature of FIG. 3 after the wet etch has been performed to remove the polymer side walls.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known structures and/or process steps have not been described in detail in order to not unnecessarily obscure the present invention.

In accordance with one aspect of the present invention, there is provided an improved metallization etching technique which substantially eliminates the photoresist-based polymer deposition on the metal lines during the plasma-enhanced metallization etch. In contrast to prior art plasma-enhanced metallization etch techniques wherein a photoresist mask is typically employed to define the metal lines during metal etching, the invention advantageously employs a plasma-enhanced etching technique wherein a hard mask is employed instead to eliminate the polymer deposition due to the photoresist fragments. More importantly, the etchant source gas is selected to include at least one side wall passivating agent to facilitate anisotropic etching and to preserve side wall profile. The side wall passivating agent is provided to create side wall passivation to compensate for the polymer deposition that is eliminated concomitant with the elimination of the photoresist mask during metallization etching. Since the volume of the side wall passivating agent may be finely controlled in a typical conventional plasma-etching equipment, it becomes possible to fine tune the process such that the amount of side wall passivation is minimized while still meeting the side wall profile requirements. Thus, the wet etch requirement may be reduced or eliminated altogether, which limits the exposure of the delicate etched metal features to the corrosive wet etch solution or even eliminates the need for a wet clean.

To the extent that a reduced wet etch process is desirable to remove any side wall passivation that may remain after metal etching, the invention, in a nonobvious manner, also serves to reduce corrosion during the wet etch process. This is because if the metallization layer is formed of two or more layers of dissimilar metals, as is often the case, the presence of dissimilar metals in the wet etch solution often results in enhanced corrosion due to electrochemical reactions. In accordance with one particularly advantageous aspect of the present invention, the hard mask is left on the metal lines during the wet etch to "cap" the metal lines and reduces its exposure to the corrosive wet etch. By "capping" the metal lines during the wet etch process, a smaller surface area of one of the metal layers is exposed to the wet etch solution, thereby reducing corrosion in a quite nonobvious manner.

In accordance with one advantageous embodiment of the present invention, the hard mask is formed of a material that also serves as part of the insulating, dielectric layer that is subsequently deposited above the etched metal lines. After etching, there is thus no need to remove the hard mask. Instead, the hard mask may be left in place to be part of the insulating, dielectric layer that may be deposited on the metal lines thereafter. If the subsequently deposited layer is to be etched down to the metal lines later, the hard mask material is preferably chosen such that it may advantageously be etched together with the subsequently deposited dielectric material in a single etching step. In this manner, the advantages associated with reduced photoresist-based polymer deposition may be achieved without requiring a separate hard mask removal step after metallization etching. This is particularly important for IC manufacturers as metal lines are often covered with a layer of insulating material in multi-metal processes.

Figure 5:
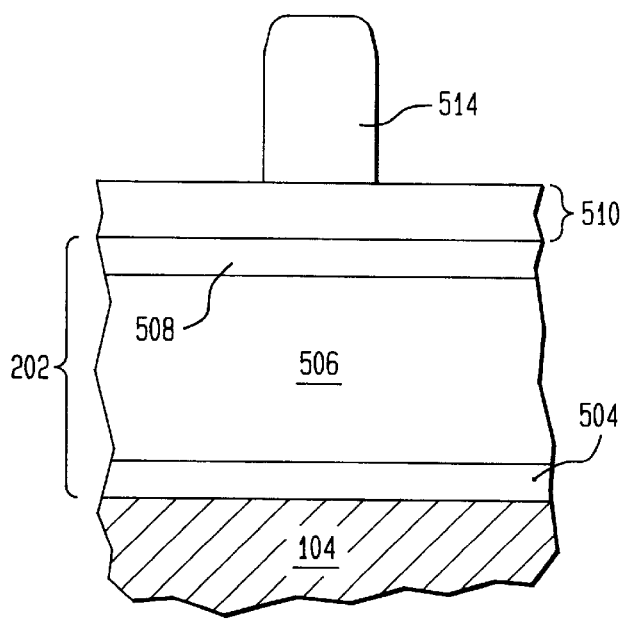
FIG. 5 depicts a metal layer disposed on a substrate, including a hard mask layer and a photoresist mask that are disposed above the metal layer to facilitate metallization etching.

To facilitate discussion of the features and advantages of the invention, a specific example of the inventive photoresist-less plasma-enhanced metallization etch technique is depicted in FIGS. 5–8. In FIG. 5, there is shown a metal layer 502, which is disposed above a substrate 104. In the specific example, metal layer 502 includes three separate layers: a barrier layer 504, a metal layer 506, and a barrier/antireflective coating (ARC) layer 508. One skilled in the art would readily recognize that barrier layer 504 and barrier/ARC layer 508 are optional and may not be necessary in every case, depending on the specific choice of materials for metal layer 502 and/or the layers that are adjacent to metal layer 502.

With reference to FIG. 5, barrier layer 504 comprises a layer of TiN overlying a Ti layer. Metal layer 506 represents an aluminum-containing layer, preferably formed of aluminum or one of the aluminum alloys such as Al/Cu or Al/Cu/Si. Barrier/ARC layer 508 also comprises a layer of TIN overlying a Ti layer. To facilitate etching through the metal layer, a hard mask layer 510 formed of a hard mask material such as SiON, oxide, SIN, FOX, or any combination thereof In one particularly advantageous embodiment, the hard mask material is SiON to permit the use of deep UV lithography thereon without requiring an additional organic ARC layer.

Figure 6:
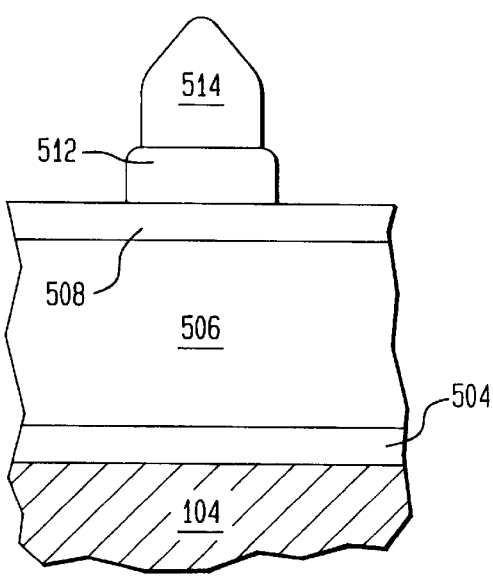
FIG. 6 depicts the substrate of FIG. 5, including a hard mask that has been etched out of the hard mask layer.

In the typical situation, an organic ARC layer is provided in between hard mask layer 510 and a subsequently formed organic photoresist mask 514. It should be noted that the organic ARC layer is included only if necessary for photolithography purposes. The photoresist organic mask contains the pattern of metal lines which will eventually be transferred to the metal layer. As a first step, however, the photoresist mask is employed to etch through the hard mask layer to transfer the pattern onto the hard mask layer, thereby forming a hard mask. In one embodiment, the hard mask comprises a bi-layer of $SiO_2$ and SiON and is etched using $CF_4$/$CHF_3$/Argon using a reactive ion etching process. In one example, the RE of the hard mask is performed in a MXP plasma processing system, which is supplied by Applied Materials, Inc. of Santa Clara, Calif. In FIG. 6, a portion of the hard mask is shown by reference number 512.

Figure 7:
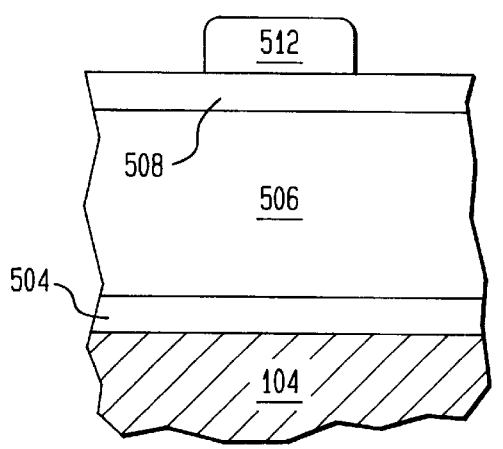
FIG. 7 shows the substrate of FIG. 6, including the hard mask after the photoresist mask has been removed.

The photoresist mask is then stripped in a conventional photoresist stripping process, such as plasma-enhanced ashing using either $O_2$ or $O_2$/$H_2O$ vapor as the ashing agent. In this manner, the photoresist mask is employed only to etch through the hard mask layer down to the metal layer. The result after photoresist strip is shown in FIG. 7.

Subsequently, the pattern of the hard mask is transferred to the metal layer using a suitable etchant. The specific etchant employed depends of course on the composition of the layers comprising the metal layer. It is desirable that the etchant be selective to the hard mask material while etching through the aluminum layer. By way of example, etchants that include $Cl_2$ have been found suitable for etching through the aluminum-containing layer.

Figure 8:
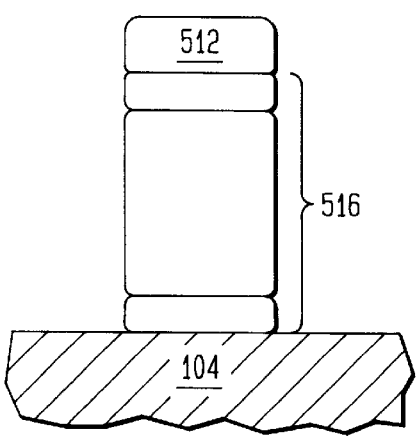
FIG. 8 shows the metallization feature of FIG. 7 after the metallization etch has been performed.

In accordance with one aspect of the present invention, it is recognized that the removal of the photoresist mask from the metallization etching process may adversely affect the etch anisotropy (e.g., the desired vertical etch profile) of the plasma-enhanced etch process (e.g., RIE) since there is no PR-based polymer side wall to protect against mask under-cutting. To preserve the etch profile, the etchant source gas that is employed to etch through the metal layer advantageously includes, in accordance with one embodiment of the present invention, at least one side wall passivating agent. The side wall passivating agents may be, for example, $N_2$, $CH_4$, $CHF_3$. Accordingly, etchants such as $Cl_2$/$HC$/$N_2$, $BCl_3$/$Cl_2$/$N_2$, $BCl_3$/$Cl_2$/$CH_4$, $BCl_3$/$Cl_2$/$N_2$/$CH_4$ may be employed to etch the aluminum-containing layer. The result after metallization etching is shown in FIG. 8, which shows metal feature 516 that is formed thereby.

By controlling the input flow rate of the side wall passivating agent, it is possible to finely tune the process to form sufficient side wall passivation to improve the etch directionality without creating an unduly thick layer of side wall passivation, which may be hard to remove afterward. This is in contrast to the prior art situation wherein the very high level of carbon-containing polymer deposition is contributed by photoresist fragments and is therefore more difficult to modulate. It is believed that the formation of carbon-containing polymer precursors such as $CCl_2$ is substantially eliminated in the present invention. With reduced polymer, less adsorbed chlorine is present in the vicinity of the metal lines to cause corrosion.

Advantageously, the thin layer of side wall passivation reduces or preferably eliminates altogether the requirement of a wet etch process after metallization etching. Even if some wet etching is required to remove all the side wall passivation, a shorter period of time or a less corrosive wet etching agent may now suffice.

After metal etching, conventional post-treatment such as plasma passivation (using, for example, a $H_2O$/$O_2$ plasma) and/or deioninzed water rinse may be performed. The plasma passivation cleans the surface of the wafer and/or removes any remaining chlorine. Thereafter, additional conventional processing may take place to form the final IC product to be used in a variety of electronics devices such as computers or consumer/commercial electronics.

SPECIFIC EXAMPLES

In the following exemplary etches, the aluminum-containing layer is etched in a TCP™ 9600SE plasma processing reactor, which is available from Lam Research Corp. of Fremont, Calif. Although specific parameters are disclosed below and have proven suitable for etching the aluminum-containing layer without using an organic-based photoresist mask in accordance with the invention, the exact parameters required for a specific machine or a specific substrate may vary and may be derived by one skilled in the art given this disclosure.

In one exemplary etch, the etchant employed is $Cl_2$/$BCl_3$/$N_2$/$CH_4$. The pressure within the plasma reactor is between about 1 mT and about 100 mT, preferably between about 3 mT and about 30 mT, and more preferably between 6 mT and 16 mT. The ratio of top power to bias power is between about 5:1 and about 1:5, preferably between about 3:1 and 1:3, and more preferably between 1.5:1 and 1:1.5. The ratio of $Cl_2$ gas flow to $BCl_3$ gas flow is between about 12:1 and about 1:3, preferably between 8:1 and about 1:2, and more preferably between about 6:1 and about 1:1.5. The percentage of $N_2$ addition to the total flow of $Cl_2$ and $BCl_3$ is between about 0% and 50%, preferably between about 2% and 30%, and more preferably between about 3% and about 25%. The percentage of $CH_4$ addition to the total flow of $Cl_2$ and $BCl_3$ is between about 0% and 20%, preferably between about 1% and 10%, and more preferably between about 2% and about 8%. The etch may also be performed in 2 or more separate steps (e.g. break-through, main etch, and over etch).

In another exemplary etch, $Cl_2/HCl/N_2$ is employed. The pressure within the plasma reactor is between about 1 mT and about 30 mT, preferably between about 3 mT and about 20 mT, and more preferably between 6 mT and about 16 mT. The ratio of top power to bias power is between about 5:1 and about 1:5, preferably between about 2:1 and about 1:2, and more preferably between 1:1 and 1:1.5. The ratio of $Cl_2$ gas flow to HCl gas flow is between about 10:1 and about 1:3, preferably between 8:1 and about 1:2, and more preferably between 5:1 and about 2:1. The percentage of $N_2$ addition to the total-flow of $Cl_2$+HCl is between about 1% and 50%, preferably between about 5% and 30%, and more preferably between about 10% and 25%. The etch may also be performed in 2 (or more) separate steps (e.g. main etch, and over etch.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A photoresist-less method for reducing polymer deposition on vertical surfaces of metal lines etched from a metallization layer disposed above a substrate employing a hard mask, comprising:
    a) forming a hard mask layer above said metallization layer;
    b) providing a photoresist organic mask that contains patterns of metal lines transferable to a metal layer above said hard mask layer;
    c) employing said photoresist organic mask to to etch through said hard mask to transfer a pattern onto the hard mask layer, thereby forming a hard mask;
    d) removing said photoresist organic mask;
    e) and performing a plasma-enhanced metallization etch employing said hard mask and an etchant source gas that includes $Cl_2$ and at least one passivation-forming chemical selected from the group consisting of HCl, $CH_4$, $N_2$ and mixtures thereof; said plasma-enhanced metallization etch being performed without employing photoresist to reduce said polymer deposition during said plasma-enhanced metallization etch.

2. The method of claim 1 wherein said performing said plasma-enhanced metallization etch includes etching said metallization layer using a reactive-ion etching (RIE) technique.

3. The method of claim 2 wherein said hard mask layer includes at least one of a $SiO_2$ layer and a SiON layer.

4. The method of claim 1 wherein said etchant source gas includes the other one of said HCl and said $N_2$.

5. A photoresist-less method for reducing corrosion of metal lines etched from a metallization layer that is disposed above a substrate employing a hard mask, comprising:

a) providing said substrate having thereon said metallization layer, said metallization layer including at least two layers having different electrochemical characteristics;

b) forming a hard mask layer above said metallization layer;

c) providing a photoresist organic mask above said hard mask layer;

d) employing said photoresist organic mask to to etch through said hard mask to transfer a pattern onto the hard mask layer, thereby forming a hard mask;

e) removing said photoresist organic mask;

performing a plasma-enhanced metallization etch employing said hard mask and an etchant source gas that includes $Cl_2$ and at least one sidewall passivation-forming chemical, wherein said plasma-enhanced metallization etch is performed without employing photoresist to reduce photoresist-based polymer deposition during said plasma-enhanced metallization etch; and f) thereafter performing a wet etch to remove polymer side walls formed during said plasma-enhanced metallization etch, said wet etch being performed while said hard mask is disposed above said metal lines to reduce said corrosion due during said wet etch.

6. The method of claim 5 wherein one of said at least two layers represents a TiN layer.

7. The method of claim 6 wherein another one of said at least two layers represents an aluminum-containing layer.

8. The method of claim 5 wherein said sidewall passivating-forming chemical is selected from $N_2$, $CH_4$, and $CHF_3$.

9. A photoresist-less method for reducing erosion during wet clean of etched metal features etched earlier from a metallization layer employing a hard mask, said wet clean being performed to remove at least one of sidewall passivation and polymer deposition on vertical surfaces of said etched metal features, comprising:

a) providing a hard mask above said metallization layer;

b) etching said metallization layer in a plasma processing chamber using said hard mask, said etching forming said etched metal features; and c) thereafter performing said wet clean without removing said hard mask, wherein said hard mask caps upper surfaces of said etched metal features to reduce exposure of said etched metal features to wet etch solution employed in said wet etch.

10. The method of claim 9 wherein said etching is performed without the use of a photoresist mask.

11. The method of claim 10 wherein said etching employs an etchant that includes a sidewall passivating agent.

12. The method of claim 11 wherein said sidewall passivating agent is one of $N_2$, $CH_4$, and $CHF_3$.

13. The method of claim 11 further comprising performing a plasma passivation prior to said performing said wet clean.

14. The method of claim 9 wherein said hard mask is employed as part of an insulating layer subsequently formed above said metal lines.

15. The method of claim 6 wherein said hard mask is formed of a hard mask material that includes at least one of $SiO_2$, SiON, SiN, or FOX.

* * * * *